(12) United States Patent
Luo et al.

(10) Patent No.: US 11,057,060 B1
(45) Date of Patent: Jul. 6, 2021

(54) METHOD AND APPARATUS FOR MATRIX FLIPPING ERROR CORRECTION

(71) Applicant: Sage Microelectronics Corporation, Campbell, CA (US)

(72) Inventors: Jianjun Luo, Campbell, CA (US); Hailuan Liu, Zhejiang (CN); Chris Tsu, Campbell, CA (US)

(73) Assignee: Sage Microelectronics Corporation, Campbell, CA (US)

(*) Notice: Subject to any disclaimer, the term of this patent is extended or adjusted under 35 U.S.C. 154(b) by 0 days.

(21) Appl. No.: 16/827,192

(22) Filed: Mar. 23, 2020

(51) Int. Cl.
*H03M 13/45* (2006.01)
*G06F 11/10* (2006.01)
*H03M 13/00* (2006.01)

(52) U.S. Cl.
CPC ....... *H03M 13/458* (2013.01); *G06F 11/1068* (2013.01); *G06F 11/1072* (2013.01); *H03M 13/616* (2013.01)

(58) Field of Classification Search
CPC .............. H03M 13/458; H03M 13/616; G06F 11/1068; G06F 11/1072
USPC .......... 714/764, 768, 773, 799, 823
See application file for complete search history.

(56) References Cited

U.S. PATENT DOCUMENTS

| | | | | |
|---|---|---|---|---|
| 4,670,881 A * | 6/1987 | Imoto | ......... | G11B 20/1809 386/272 |
| 5,271,022 A * | 12/1993 | Berlekamp | ......... | G03B 31/02 386/E9.045 |
| 5,886,654 A * | 3/1999 | Ichikawa | ......... | G11B 20/1833 341/94 |
| 2003/0002408 A1* | 1/2003 | Kuroda | ......... | G11B 20/1403 369/47.28 |
| 2009/0183053 A1* | 7/2009 | Ito | ......... | G06F 11/106 714/764 |
| 2009/0199073 A1* | 8/2009 | Kanaoka | ......... | H03M 13/2721 714/758 |
| 2012/0314480 A1* | 12/2012 | Onishi | ......... | G06F 11/1048 365/148 |
| 2016/0266971 A1* | 9/2016 | Torii | ......... | G06F 11/1048 |
| 2017/0187395 A1* | 6/2017 | Watanabe | ......... | H03M 13/2909 |
| 2018/0004601 A1* | 1/2018 | Lee | ......... | G06F 11/1076 |
| 2018/0083653 A1* | 3/2018 | Khayat | ......... | G06F 11/1068 |
| 2018/0219561 A1* | 8/2018 | Litsyn | ......... | H03M 13/2948 |
| 2019/0034266 A1* | 1/2019 | Terada | ......... | G06F 12/16 |
| 2019/0087265 A1* | 3/2019 | Kifune | ......... | H03M 13/3905 |
| 2020/0264951 A1* | 8/2020 | Yamagishi | ......... | H03M 13/2906 |

OTHER PUBLICATIONS

Li et al., Efficient Implementations of Multiple Bit Burst Error Correction for Memories, Oct. 1, 2018, IEEE, pp. 1-3. (Year: 2018).*

(Continued)

*Primary Examiner* — John J Tabone, Jr.
(74) *Attorney, Agent, or Firm* — Joe Zheng

(57) ABSTRACT

A technique of extending a correction limit defined by an ECC is described. According to one aspect of the present invention, remaining errors that cannot be corrected by the ECCs in a data array is first identified and then formed in form of matrix with defined size. These remaining errors are flipped in value, namely from "1" to "0" or "0' to "1" if the number of the errors are within a range or additional ECCs are applied to correct the errors in flipped data bits.

19 Claims, 14 Drawing Sheets

(56) References Cited

OTHER PUBLICATIONS

Rahman et al., Soft Error Tolerance using Horizontal-Vertical Double-Bit Diagonal Parity Method, May 2015, ICEEICT, pp. 1-6. (Year: 2015).*

Sharma et al., An HVD Based Error Detection and Correction of Soft Errors in Semiconductor Memories Used for Space Applications, Mar. 2012, IEEE, pp. 1-5. (Year: 2012).*

* cited by examiner

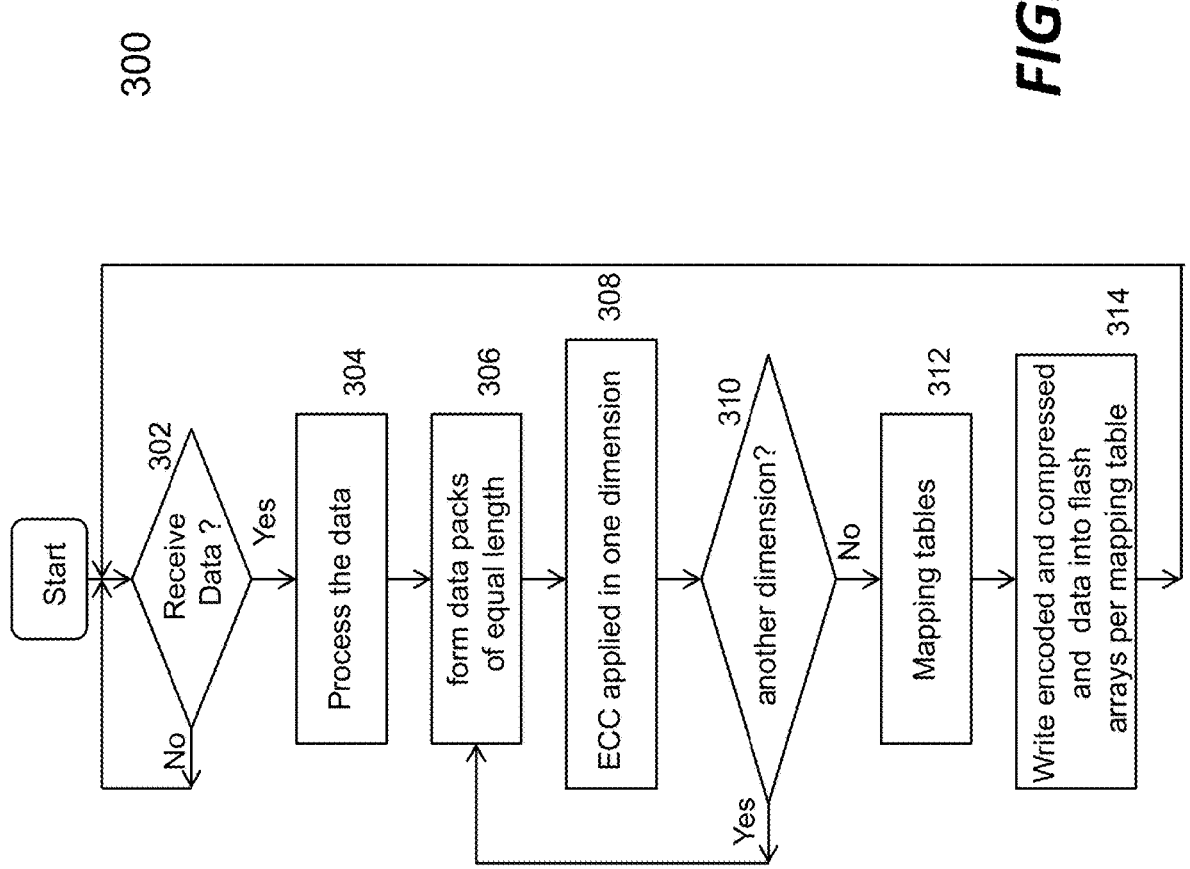

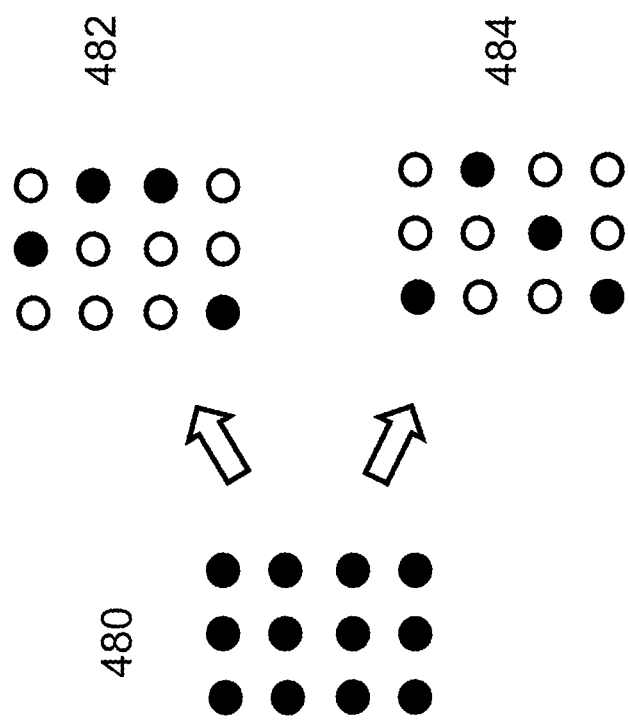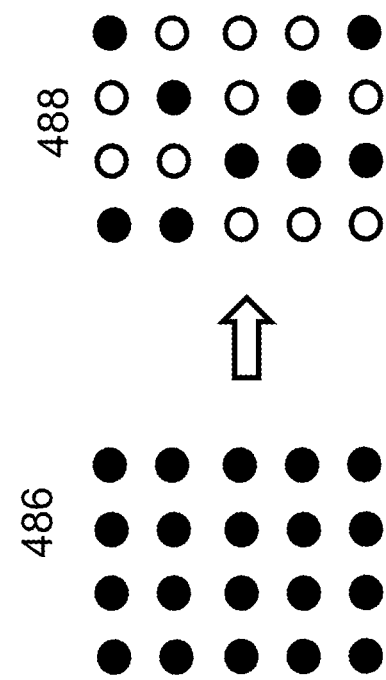
FIG. 4H
FIG. 4I

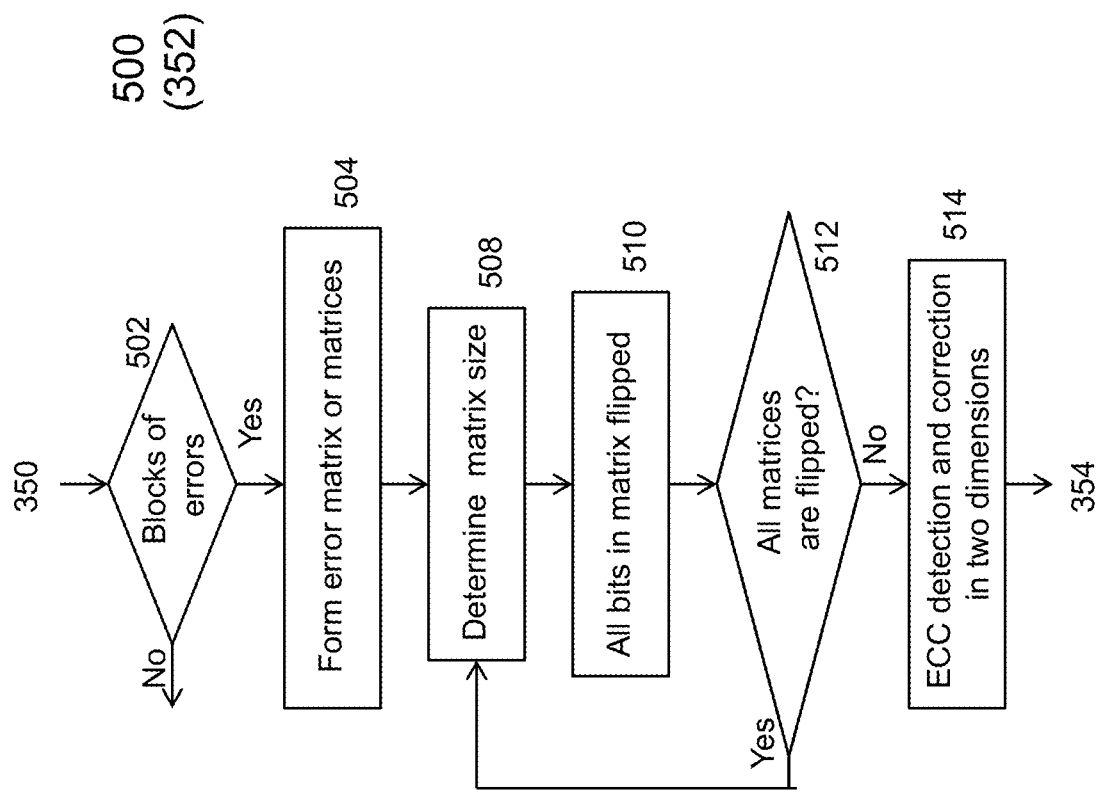

METHOD AND APPARATUS FOR MATRIX FLIPPING ERROR CORRECTION

BACKGROUND OF THE INVENTION

Field of Invention

The invention generally is related to the area of data management for storage, and more particularly related to data integrity and error correction in data management, and method and apparatus for method and apparatus for matrix flipping error correction.

Related Art

Various electronic data is being created every moment. Retaining or storing the data is increasingly demanded than ever. Various technologies and devices have been developed to store the data. Data storage often includes hardware components and recording media to retain the digital data. Examples of the recording media include punch cards, hard drive disks, floppy disks, magnetic tapes, optical discs and semiconductors. Among the semiconductor-based recording media, flash memory is a type of nonvolatile memory that can be electrically erased and reprogrammed and is being used in many applications. One common use of the flash memory is the solid state drives (SSD) that can hold enormous amounts of data in very small size, enabling various kinds of new applications for many industries as well as consumer uses.

One of the problems with the flash memory is the data errors that may be caused by memory wear, read disturb error, program disturb error, over-programming error, retention error and others. These errors are becoming increasingly concerned with the continued scaling of NAND flash technology and advancements in multi-level cell (MLC) technologies, especially with nanometer-regime process geometries. Error Correction Code or Error Correcting Code (ECC) is commonly used with NAND flash memory to detect and correct bit errors that may occur with the memory. However, the flash memory bit error rates increase with the number of program/erase cycles and the scaling of technology. Therefore there is a need to correct more errors using the ECC without allocating more spaces for error correction codes. Without adding additional costs or impacting operation performance, there is another need for a technique that can be easily used to support higher raw bit error rates and enhance the lifespan of NAND flash memory.

An ECC is an algorithm of encoding an original message with redundant information in the form of an ECC. The redundancy allows a receiver to detect a limited number of errors that may occur anywhere in the message, and often to correct these errors if the number of errors is within a limit. The correction limit or the number of errors an ECC can detect and correct depends on the underlying encoding scheme used. A common example is Hamming code. Among many Hamming codes, an exemplary Hamming (7, 4) code encodes four bits of data into seven bits by adding three parity bits. With a given capacity of flash memory arrays, the more parity bits are allocated, the less storage capacity the flash memory arrays may offer. Accordingly, there is yet another need for techniques that can extend the correction limit without compromising the storage capacity of a store medium (e.g., flash memory arrays).

SUMMARY OF THE INVENTION

This section is for the purpose of summarizing some aspects of the present invention and to briefly introduce some preferred embodiments. Simplifications or omissions in this section as well as in the abstract may be made to avoid obscuring the purpose of this section and the abstract. Such simplifications or omissions are not intended to limit the scope of the present invention.

The present invention generally pertains to method and apparatus for extending correcting limits in ECC when used in data arrays (e.g. data bits in flash memories). According to one aspect of the present invention, data to be transmitted or stored in an unreliable environment is encoded in accordance with an ECC-based encoding in two dimensions. Depending on implementation, the data may be compressed prior to the encoding. When requested, the ECC-encoded data is decoded first in two dimensions and followed by what is herein referred to as matrix error flipping correction when it is determined that the size of errors in an error matrix is within a predefined limit or range.

According to still another aspect of the present invention, the ECC-encoded data may be recursively decoded with the ECC and matrix error flipping correction to extend the correction limits in the ECC.

According to still another aspect of the present invention, ECC-based decoding operations are implemented in a controller or processor provided to access data, for example, stored data in flash memory arrays. The processor may also be used to encode original data in accordance with predefined ECCs. Such a processor is designed to execute firmware or codes to perform operations of encoding or decoding data according to one embodiment of the present invention.

According to yet another aspect of the present invention, when errors in a dimension exceed the maximum number of errors the ECC can correct but still less than a threshold, these errors are isolated but formed in form of a matrix (a.k.a., an error matrix) and subsequently corrected by flipping data bits in the error matrix.

The present invention may be implemented as an apparatus, a method, and a part of system. Different implementations may yield different benefits, objects and advantages. In one embodiment, the present invention is a method for keeping integrity of data read from a memory array, the method comprises: receiving an array of data bits; forming at least an error matrix by consolidating errors in the array of data bits in the error matrix; flipping all values of data bits in the error matrix, from "1" to "0" or "0" to "1", to update the array of data bits with flipped data bits in the error matrix; applying a first predefined ECC decoding operation to the array of data bits with flipped data bits along a first dimension to detect and correct errors in the flipped data bits to produce the array of data bits with some corrected data bits; and applying a second predefined ECC decoding operation to the array of data bits with some corrected data along a second dimension to detect and correct remaining errors in the flipped data bits.

According to another embodiment, the present invention is an apparatus for keeping integrity of data read, the apparatus comprises: a medium store (e.g., non-transitory computer readable medium) for keeping code; a processor, coupled to the medium store, executing the code and performing operations of the above method. The first predefined ECC is defined by a first maximum number ($MAX_{1st}$) of errors the first predefined ECC is able to correct. The second predefined ECC is defined by a second maximum number ($MAX_{2nd}$) of errors the second predefined ECC is able to correct. A number of the errors in a row in the error matrix is within ($MAX_{1st}+1$, $2MAX_{1st}+1$) and a number of the errors in a column in the error matrix is within ($MAX_{2nd}+1$, $2MAX_{2nd}+1$). Depending on implementation or representation of the data bits in an array, $MAX_{1st}$ or $MAX_{2nd}$ may be either $MAX_{ROW}$ or $MAX_{COL}$, referring respectively for a row or column of data bits.

There are many other objects, together with the foregoing attained in the exercise of the invention in the following description and resulting in the embodiment illustrated in the accompanying drawings.

BRIEF DESCRIPTION OF THE FIGURES

These and other features, aspects, and advantages of the present invention will be better understood with regard to the following description, appended claims, and accompanying drawings where:

FIG. 3A shows a flowchart or process of writing a data stream into a flash memory array according to one embodiment of the present invention;

FIG. 4H shows an example of 3×4 error matrix and two corresponding exemplary possibilities, assuming $MAX_{ROW}=2$ and $MAX_{COL}=3$;

FIG. 4I shows another example of an expanded error matrix 4×5, assuming $MAX_{ROW}=2$ and $MAX_{COL}=3$;

FIG. 5A shows a flowchart or process of matrix error flipping correction according to one embodiment of the present invention.

DETAILED DESCRIPTION OF THE INVENTION

The detailed description of the invention is presented largely in terms of procedures, steps, logic blocks, processing, and other symbolic representations that directly or indirectly resemble the operations of communication or storage devices that may or may not be coupled to networks. These process descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Figure 1:
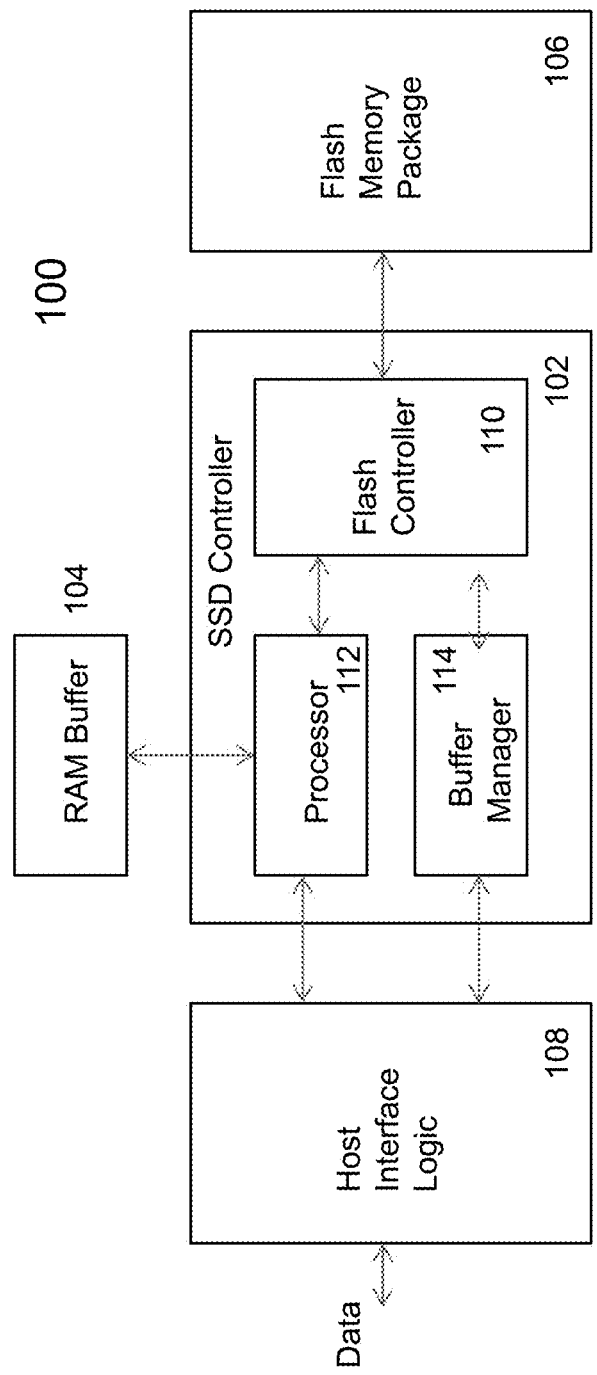
FIG. 1 shows an exemplary architecture of Solid State Device (SSD) that includes an SSD controller, a RAM buffer, a flash memory package and an interface.

One of the important objects, advantages and benefits in the present invention is to improve the data integrity and the reliability of data in communication or memory cells, especially in NAND flash memory cells. FIG. 1 shows an exemplary architecture of Solid State Device (SSD) 100 that includes an SSD controller 102, a RAM buffer 104, a flash memory package 106 and an interface 108. The SSD controller 102 manages the data stored on flash memory package 106 and communicates with a host device. When a host system or device needs to read data from or write data into the SSD 100, it will communicate with the SSD controller 102. Through the interface 108 (e.g., eSATA, USB, eMMC, CF cards, SD/micro SD cards and PCIe), data from a host device (not shown) is coupled in, processed in the SSD controller 102 and stored in the recording media, namely the flash memory package or arrays 106. To keep track of how the data is organized on the media 106, various mapping tables are maintained by the SSD controller 102, where one or more of the mapping tables record where the data or data bits are stored in the flash memory arrays 106. In some high-performance SSD, the RAM buffer 104 is provided to increase the amount of mapping data immediately available and to cache data that has been written by the host device.

The SSD controller 102 is shown to include a flash controller 110, a processor 112 and a buffer manager 114. Under the processor 112, the controller 110 and the buffer manager 114 execute some firmware to manage where and how the data is stored exactly in the flash memory arrays 106, and from which the stored data can be selectively located and read out when a host needs some or all of the data.

One of the objectives, advantages and benefits in the present invention is the designs of matrix error flipping correction that extend the correction limit an ECC has. Because of the inherently unreliable nature of NAND memory, the stored data in NAND Flash may not hold its correct values, namely the data bits flipped unexpectedly. As the quantity of data bits influenced by this statistically small and very much portrayed, the flash controller can be controlled to perform a coordinating level of error correction to accomplish the required dependability and reliability.

It is known in the art that error correcting code (ECC) is an encoding scheme that transmits data in binary numbers in such a way that the data can be recovered even if some bits are erroneously flipped. Various ECC methods are used in practically all cases of data transmission, especially in data storage where ECCs defend against data corruption. In implementation, ECC is an algorithm for expressing a sequence of extra numbers to be embedded in or appended to a sequence of data bits such that a limited number of the data bits unexpectedly flipped (e.g., from "0" to "1" or "1"

to "0") can be detected and corrected based on the extra numbers. When data is stored in nonvolatile memory, it is crucial to have the mechanism that can detect and correct a certain number of errors.

Error correction code (ECC) can encode k data bits to become a block of n bits called a code word. A block code (linear or not) works efficiently with a fixed data length, takes k data bits and computes m parity bits, where m=n−k. In general, the larger m is, the more errors the ECC may be able to correct. To maximize the data storage capacity in a given flash memory array, the length m is designed practically limited.

Figure 2:
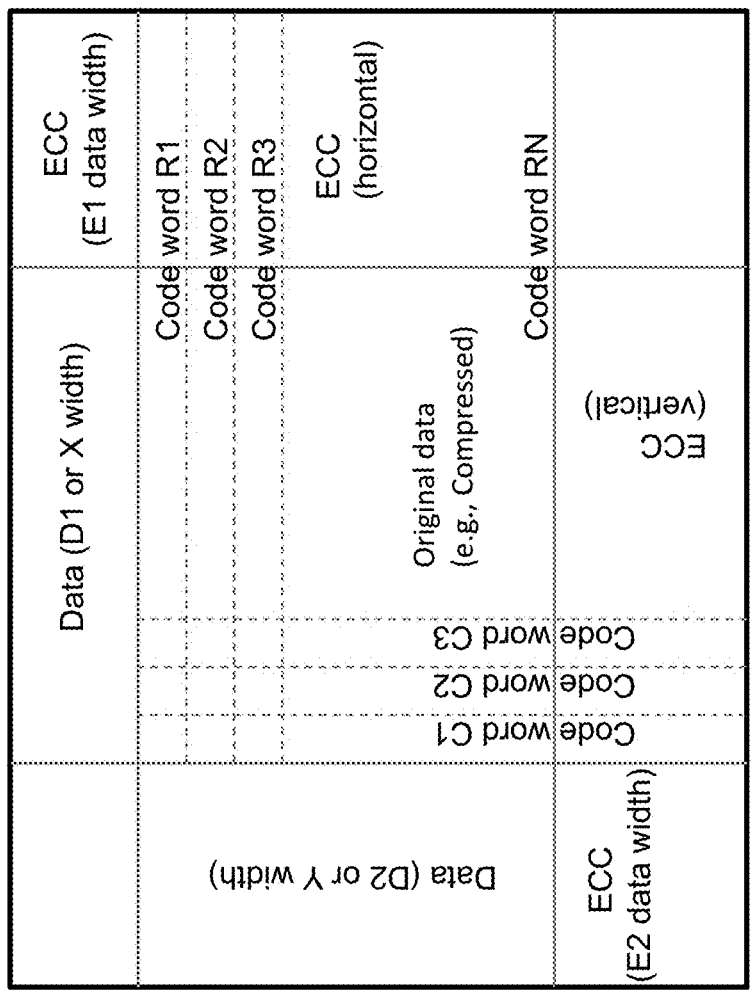
FIG. 2 shows an example of applying the ECC in two dimensions or horizontal and vertical directions.

According to one embodiment, at a point when the data is written to flash memory arrays, the ECC is registered and stored together with the data (original, preprocessed or compressed), resulting in ECC encoded data or code words. At the point when the encoded data is read back, the ECC is recomputed and analyzed against that already stored on the flash memory arrays to recover the data. FIG. 2 shows an example of applying the ECC in two dimensions or horizontal and vertical directions. Different from the traditional use of ECC that is simply applied to a sequence of data bits once, the ECC is applied across the data horizontally first and then vertically, or vice versa, according to one embodiment. In operation, the original data along the horizontal direction is encoded first with a predefined ECC scheme, resulting rows of code words (original data+ECC codes or other bits), R1, R2, . . . RN.

According to one embodiment, an ECC scheme based on Hamming code is used. Hamming code is a set of error-correction codes that can be used to detect and correct the errors that are introduced to the encoded data. For example, if the number of data bits is 7, then the number of redundant bits is 4, satisfying $2^r \geq m+r+1$, where r=redundant bit and m=data bit. After the data bits are encoded with the redundant bits, the code word is 11 bits in length. FIG. 2 shows that, in each row, data bits are D1 bits or X in length and E1 bits for the parity or redundant bits. Those skilled in the art can appreciate that these E1 redundant bits are often encoded within the D1 data bits even though there are collectively and graphically shown at the end of the data bits.

There are now N rows of code words. A predefined ECC scheme is applied vertically. Although the ECC scheme applied vertically does not have to be the one that has been applied horizontally, it is assumed herein that the ECC applied is the same vertically or horizontally. One difference is that the data bits along the vertical direction ($2^{nd}$ dimension) are not from the same data bits in a row. These data bits are from the rows of the code words and encoded with a set of redundant bits per the ECC scheme. Those skilled in the art shall understand that the operation as described above may be applied vertically first then horizontally.

FIG. 2 shows another way of encoding the original data bits with ECC according to one embodiment of the present invention. In operation, a predefined ECC operation is applied to horizontal and vertical data bits simultaneously or one after another. In the case that the redundant bits are embedded in the original data bits, they can be addressed to the end of a line of data bits to ensure that the original data bits get encoded with the ECC.

FIG. 3A shows a flowchart or process 300 of writing a data stream into a flash memory array according to one embodiment of the present invention. The flowchart 300 may be better appreciated in view of FIGS. 2A-2B.3 and implemented in hardware or in combination of software (e.g., firmware) and hardware. The flowchart 300 starts when a data stream is received or coupled in at 302. The data stream may be pertaining to a file, a photo and an audio/video from a host device (e.g., a laptop computer). When a user desires to store a file into a storage device (e.g., SSD), the data stream is received.

At 304, the data stream may be initially preprocessed, for example, compressed in accordance with a compression scheme. At 306, where data packs for the processed data are formed in accordance with a chosen ECC (e.g., Hamming code or BCH code). As used herein, a data pack is a serial of bits in a fixed length, one example of the fixed length is that that data bits just fit into a portion or a page in a flash memory while a block is a serial of bits that just fits into a block in a flash memory. It should be noted that a block is the smallest unit in a flash memory that can be erased while a page is the smallest unit in the flash memory that can be programmed (i.e. written therein). The common block size is typically in a range of 4-8 MB in size and the common page size is typically in a range of 8-16 KB in size. The architecture of NAND flash memories dictate that data is written or read in pages, typically between 4 KiB and 16 KiB in size, but can only be erased at the level of entire blocks consisting of multiple pages and MB in size. To facilitate the description of the present invention, a (data) page herein is often graphically presented as a series of cells along a direction, such as a horizontal (data) page or a vertical (data) page, to indicate that the memory cells in a page, even they might be physically in multiple lines, are all used to store a data pack along one dimension.

At 308, the predefined ECC is applied to the formed data pack. In operation, the encoded data bits, any padded bits if needed (with known values) and the redundant bits from the ECC are written into the flash memory. At 310, the process 300 goes back to 306, where the data packs along another dimension formed. In one embodiment, the dimension is 2, namely horizontal and vertical. If the first pass is for the horizontal dimension, the second ECC is now applied vertically. The data packs are formed as described above across all data packs formed in the first pass. With the reserved spaces for the redundant bits from the ECC, additional padded bits with known values are added to fill up the page to be written in the flash memory.

Referring now back to FIG. 3A, the code words are stored in the allocated spaces shown in FIG. 2 and managed by one or more mapping tables. At 312, the mapping tables are concurrently generated or updated to record when the data bits of the data are stored in the flash memory arrays. Once the data are encoded horizontally and vertically, the process 300 goes on 314 to finish writing the data into the flash memory arrays.

Figure 3B:
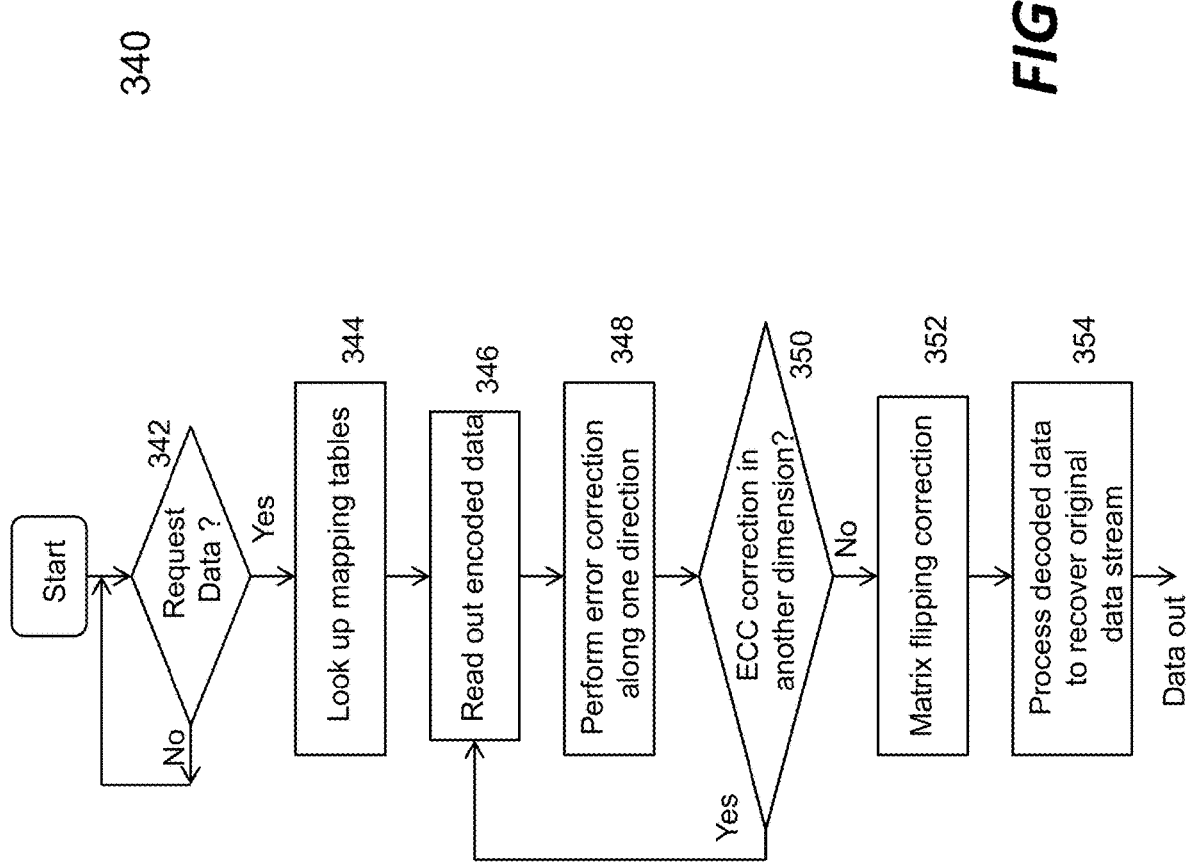
FIG. 3B shows a flowchart or process of detecting and correcting errors in stored data according to one embodiment of the present invention.

FIG. 3B shows a flowchart or process 340 of detecting and correcting errors in stored data according to one embodiment of the present invention. The flowchart 340 may be better appreciated in view of FIG. 2 and FIG. 3A, and implemented in hardware or in combination of software (e.g., firmware) and hardware. The flowchart 340 starts when there is a data request from a host device (e.g., a media player) for a file, data of which is stored in a flash memory array. Upon receiving the request, a flash controller checks with the mapping tables that may be stored in a separate memory (e.g., RAM) or the flash memory array. Given the mapping tables, the data for the requested file is located in the flash memory array and bits of the data are read out for error detection and correction first before they are sent out or become available to the host device.

The mapping tables are provided to facilitate the translation of a logical address from a file system to a physical address of flash memory. The mapping tables are created or updated when a file is written or saved in the flash memory. At 344, the stored mapping tables are accessed, from which data bits pertaining to the requested file are read out at 346. However, some of the stored data bits may have been corrupted in reality, for example "1" to "0" or "0" to "1".

At 348, these data bits are checked per the registered ECC to see if there are any errors. If there are some, depending on the number of errors, they can be readily corrected or corrected with extra effort. If the number of errors exceeds a threshold (correction limit) per the ECC, the errors cannot be corrected and an error would be reported. At 350, these data bits are checked again per the registered ECC in another dimension to see if there are any errors. If there are some, depending on the number of errors, they can be readily corrected or corrected with extra effort.

Figure 4A:
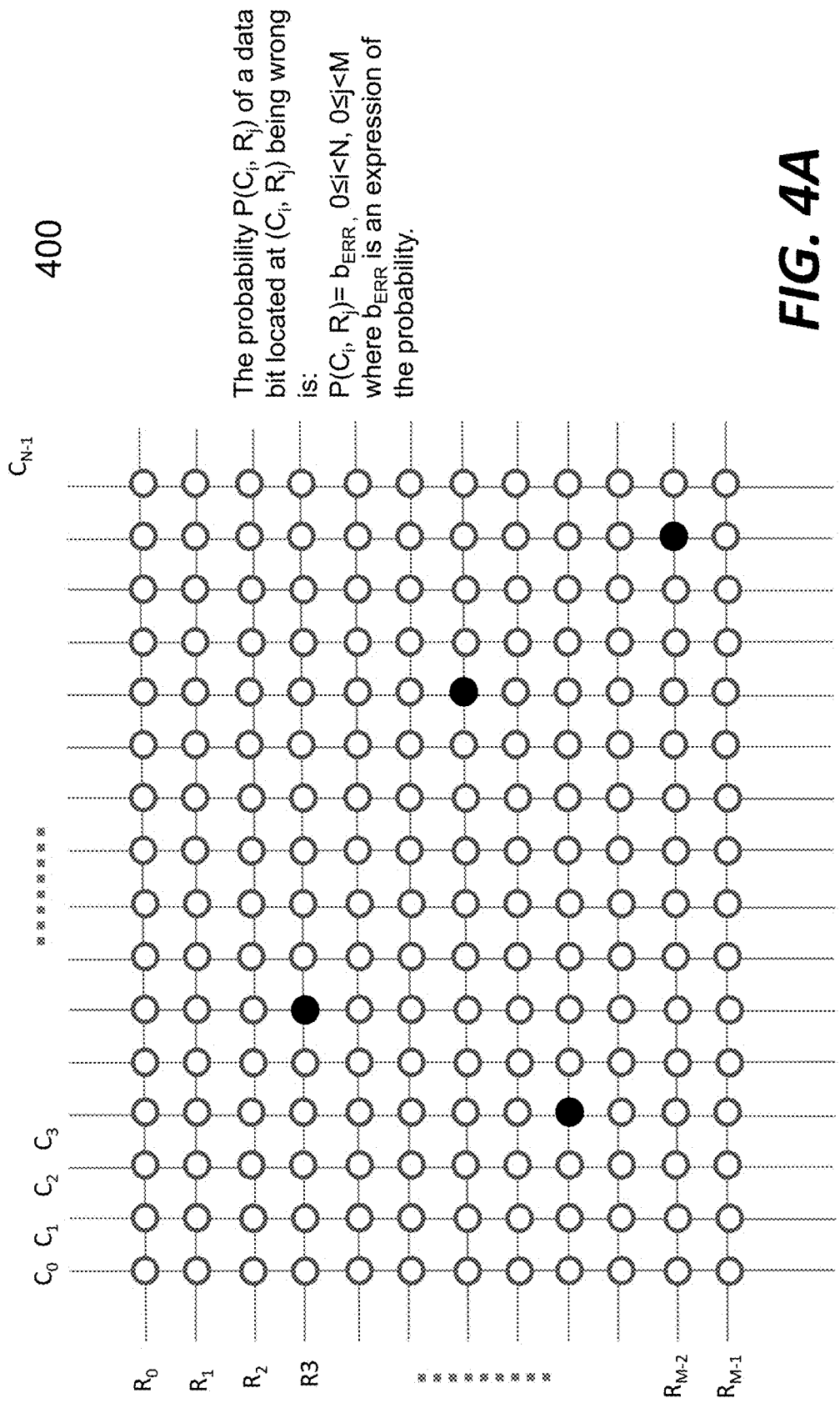
FIG. 4A shows an exemplary array of data bits with some being corrupted, each of the data bits is assumed in one of memory cells arranged in M×N.

At 352, the process 340 performs the matrix error flipping correction. It shall be understood that the process 340 comes to 352 when the ECC has been applied respectively in two dimensions, and possibly repeatedly. To facilitate the understanding at 352 how errors are detected and corrected in one embodiment of the present invention, referring now to FIG. 4A, it shows an exemplary array of data bits 400, each is assumed in or from one of memory cells M×N. The blackened dots represent a set of random errors. It may be appreciated that these errors are readily detected and corrected by the ECC encoded in the data as the number of errors is less than the maximum (MAX) of errors the ECC is designed to correct when viewed along a row or a column, where both of $MAX_{ROW}$ and $MAX_{COL}$ are assumed to be at least 2.

Figure 4B:
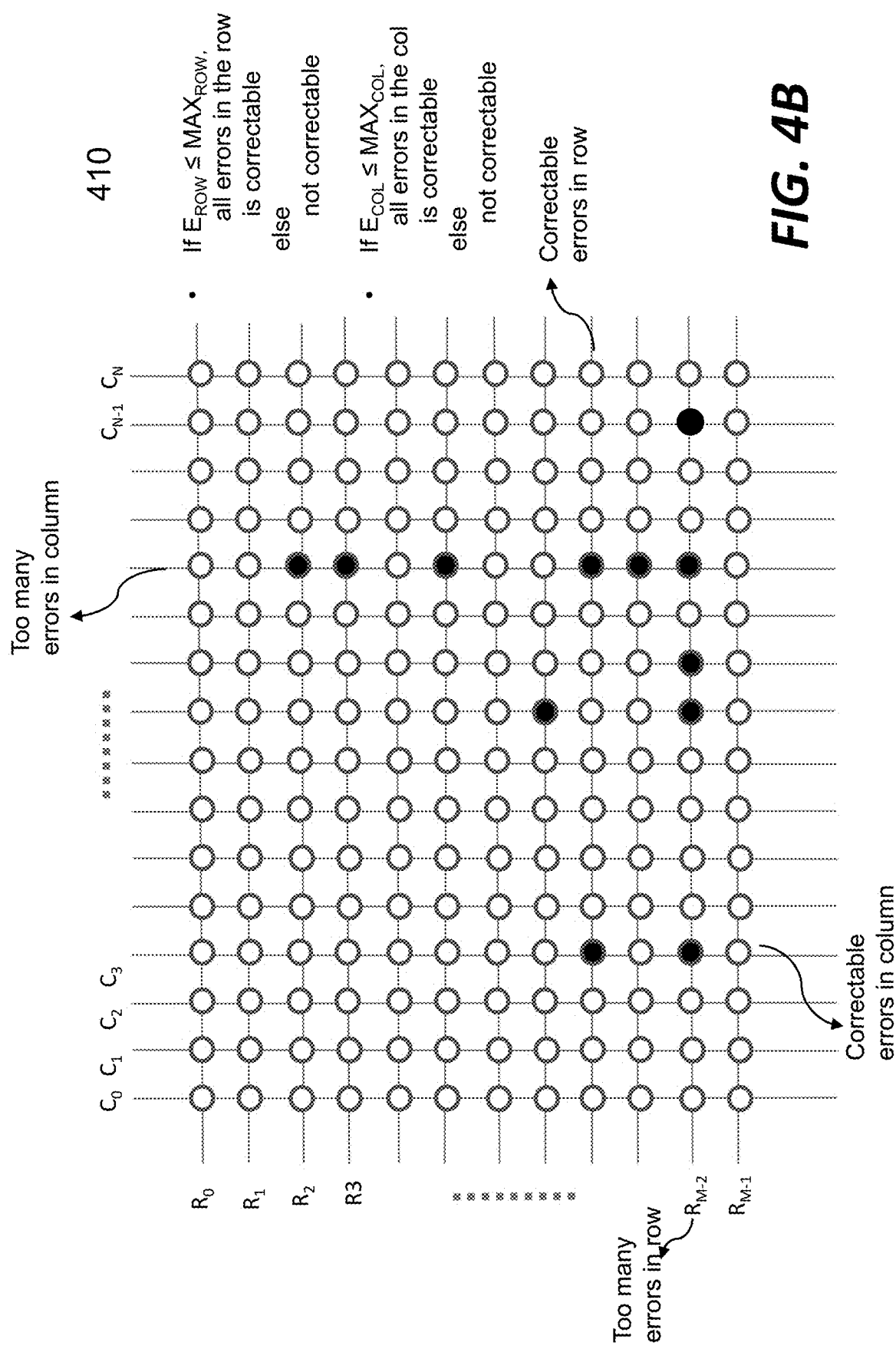
FIG. 4B shows another exemplary array of data bits with more errors.

FIG. 4B shows another exemplary array of data bits 410, there are labeled more errors. Some of the errors are correctable if the number of errors in a row or column is less than the MAX (i.e., $MAX_{ROW}$ or $MAX_{COL}$). But some of the errors are no longer correctable if the number of errors in a row ($E_{ROW}$) or column ($E_{COL}$) is greater than the MAX, resulting in corrupted data. One of the objects, advantages and benefits in the present invention is that some of the corrected data may still be corrected with some extra effort.

Figure 4C:
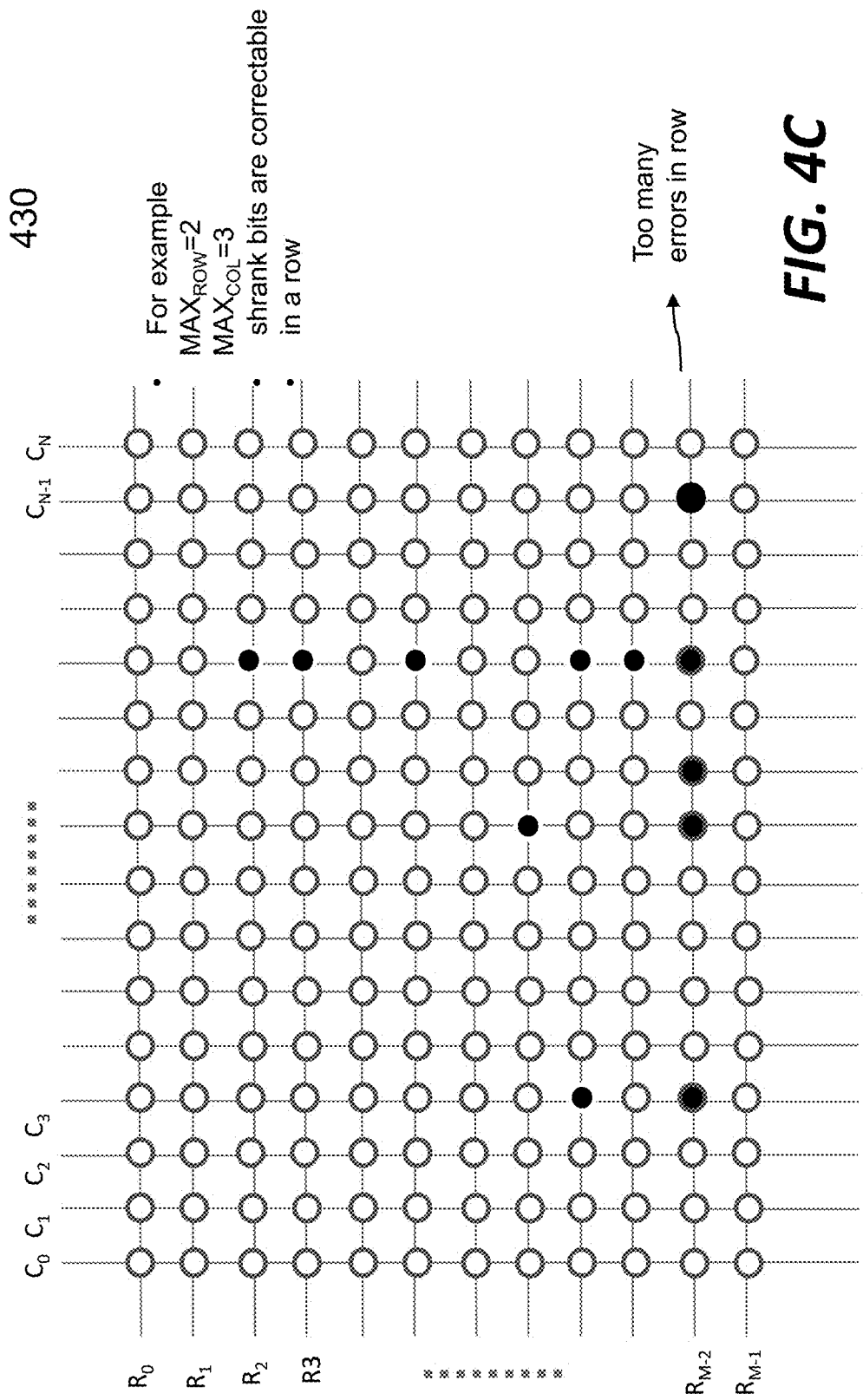
FIG. 4C shows that the array of data bits of FIG. 4B has been corrected in accordance with the ECC along one dimension (e.g., horizontal or row)
Figure 4D:
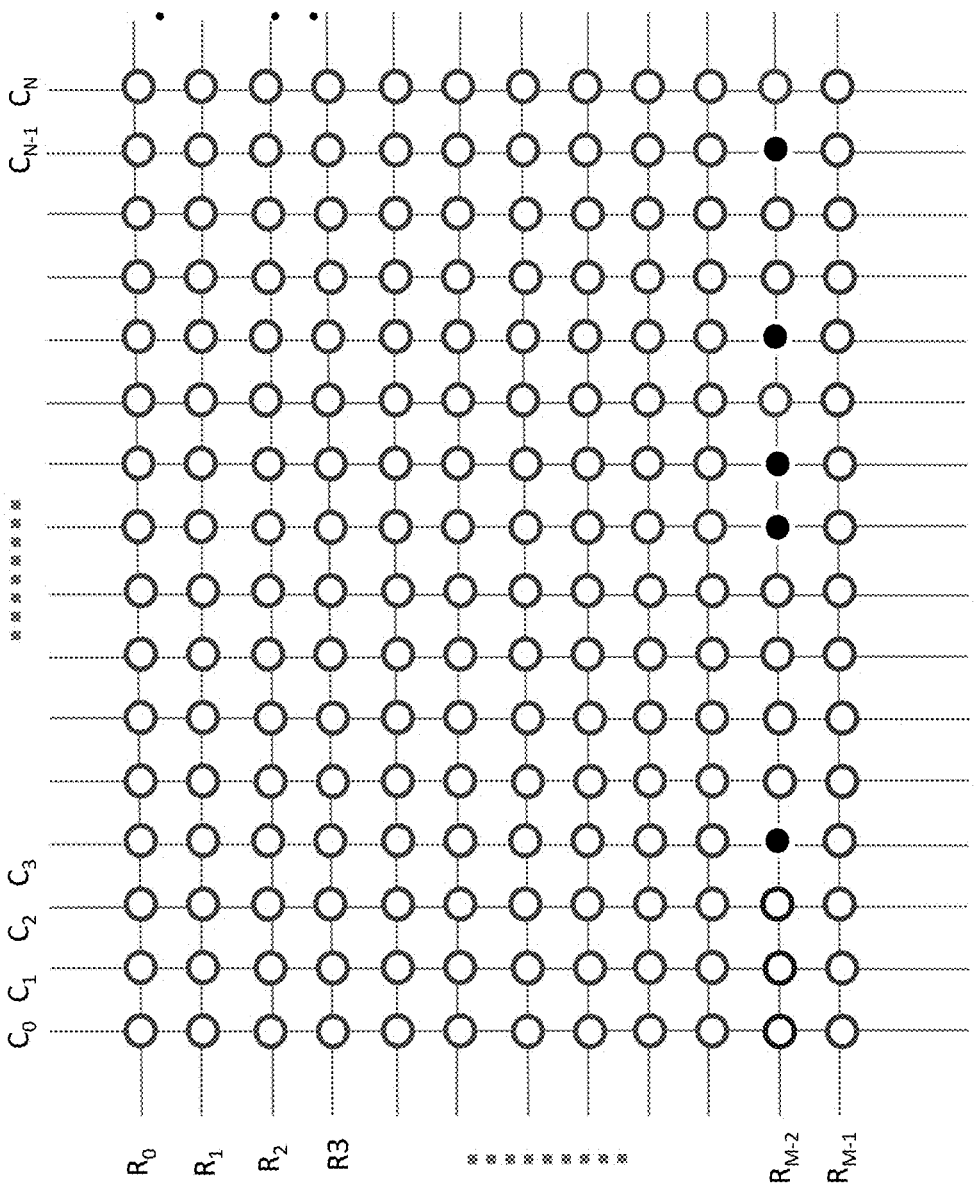
FIG. 4D shows that the number of errors exceeding the maximum number ($MAX_{ROW}$) of errors the ECC is able to correct when the ECC is applied in another dimension (e.g., vertically or column)

FIG. 4C shows that the array of data bits 410 of FIG. 4B has been corrected in accordance with the ECC along the row. It is assumed that MAX for row ($MAX_{ROW}$) is 2. In other words, if the number of bit errors is less than $MAX_{ROW}$, the errors in the row are correctable. FIG. 4C shows all errors in the rows have been corrected (shown as smaller blackened dots) except for those in one row as the number of errors in that row exceeds $MAX_{ROW}$. As the data bits are stored in 2 dimensions, the error correction process can be applied again across all the columns. FIG. 4D shows that the number of errors exceeding $MAX_{ROW}$ can be corrected (shown as smaller blackened dots) when ECC is applied vertically. It should be noted that the ECC may be repeatedly applied to further correct the errors if needed.

Figure 4E:
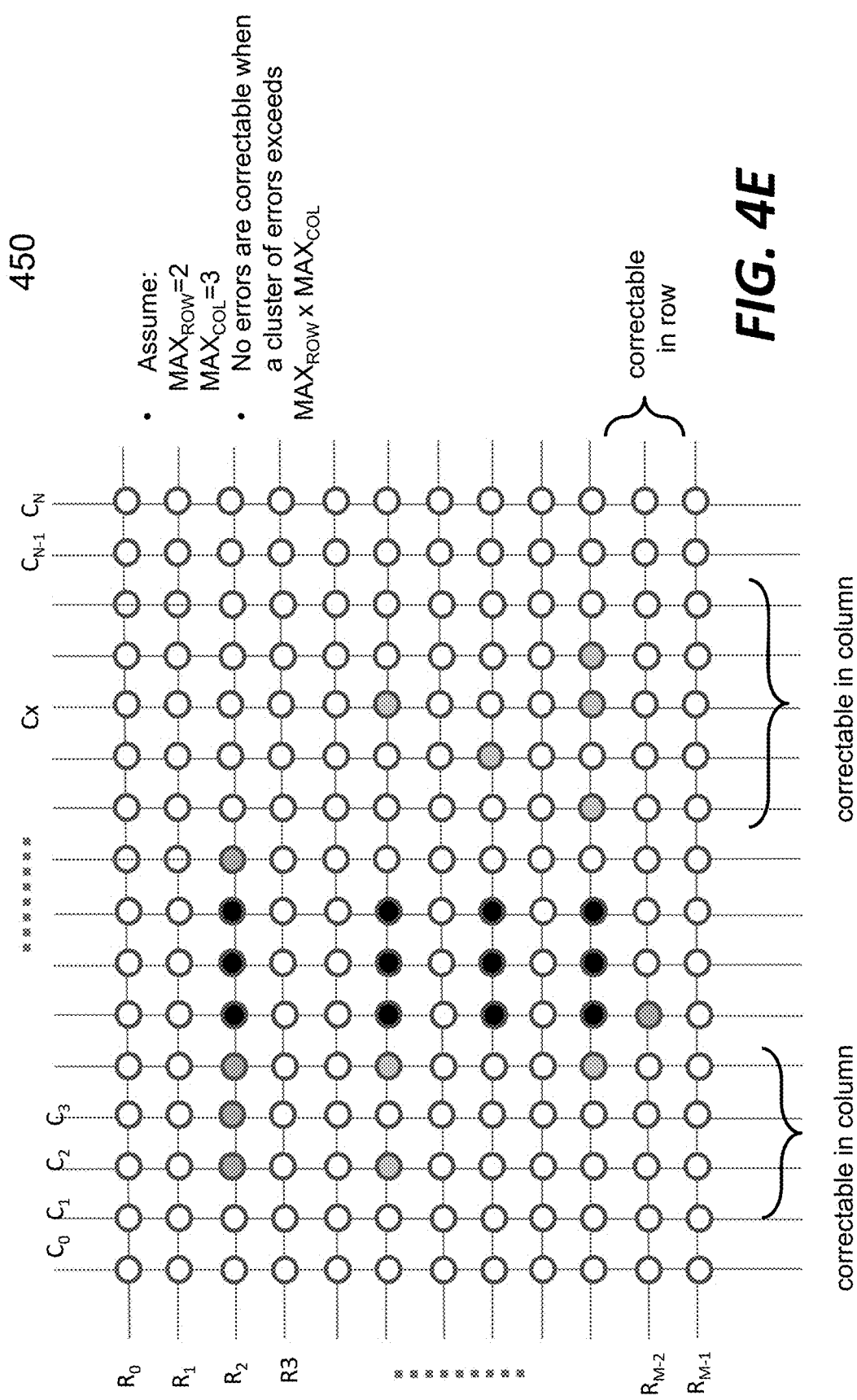
FIG. 4E shows a situation in which the errors in multiple lines (rows and columns) are all exceeding $MAX_{ROW}$ or $MAX_{COL}$.

FIG. 4E shows a situation 450 in which the errors in multiple lines (rows and columns) are all exceeding $MAX_{ROW}$ or $MAX_{COL}$. An ECC operation is first applied across the rows and then columns to correct those errors that are correctable, resulting in FIG. 4F that shows a data layout 460 with errors that cannot be corrected by simply applying ECC vertically or horizontally as the number of the errors in a line exceeds $MAX_{ROW}$ or $MAX_{COL}$. In other words, the ECC is applied horizontally and then vertically (or vice versa), the ECC can be applied again horizontally and then vertically as the corrected errors would be used to facilitate the correction of other errors.

In a perspective, after the ECC is applied to the data layout 450, the errors in 460 are isolated or stand out. In other words, it is ready to know that there is a block or cluster of errors. A simple correction to the cluster would correct all the errors in the cluster. In operation, all the data bits in the cluster are reversed, namely "1"s are changed to "0" and "0"s are changed to "1". As a result, the all the errors in the situation 450 are corrected.

Figure 4F:
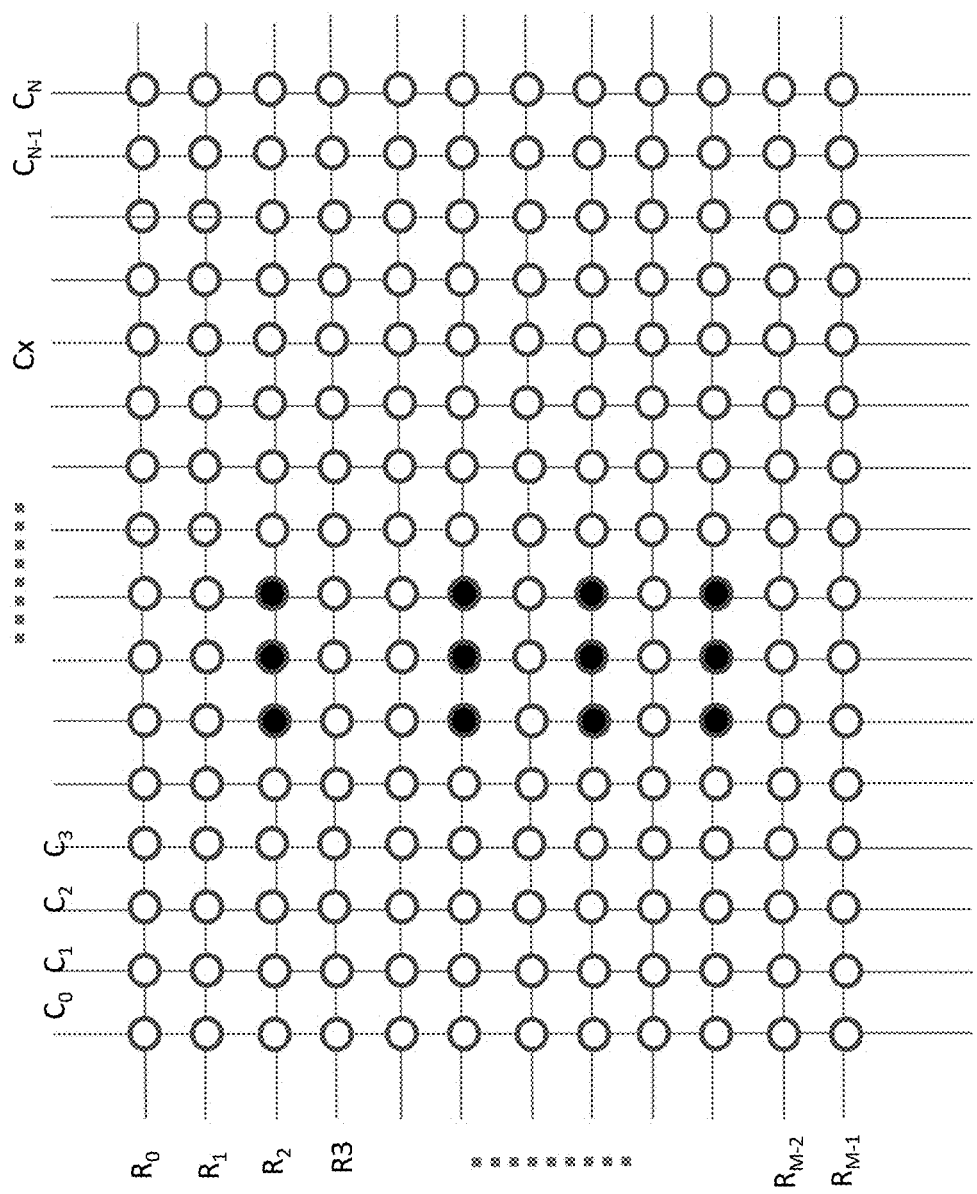
FIG. 4F shows a data layout with errors that cannot be corrected by the ECC vertically or horizontally as the number of the errors in a line exceeds $MAX_{ROW}$ or $MAX_{COL}$.
Figure 4G:
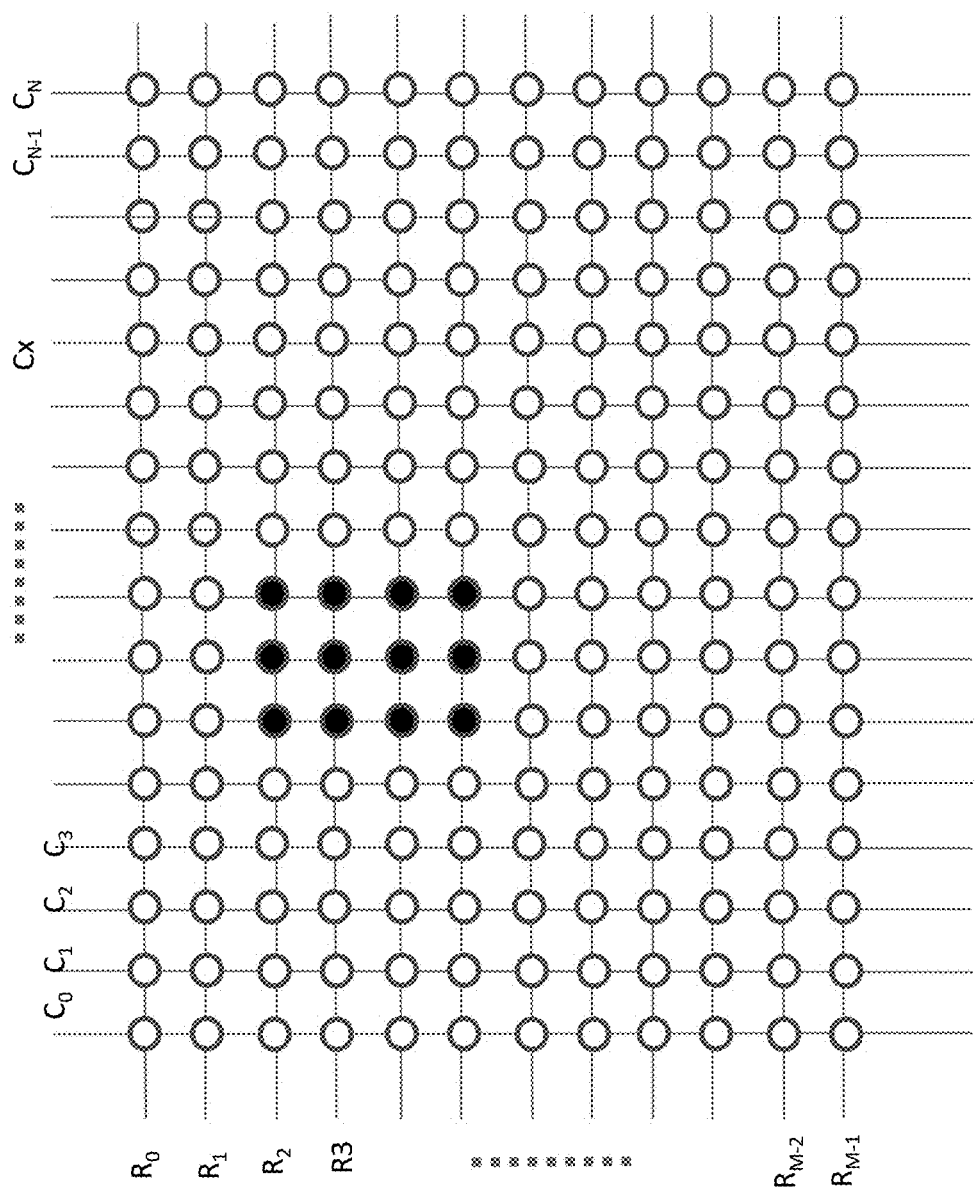
FIG. 4G shows a rearrangement of FIG. 4F, where the remaining errors are rearranged to graphically show a corrupted data array or a matrix 3×4 which is greater than $MAX_{ROW} \times MAX_{COL}$.

The situation in FIG. 4F works when the number of errors in a block or matrix is within a limit. FIG. 4G shows a rearrangement of the rows still with errors with the assumption of $MAX_{ROW}=2$ and $MAX_{COL}=3$. When these errors are reversed, errors would be reduced. FIG. 4H shows an example of 3×4 error matrix 380. Two exemplary possibilities 482 and 494 are shown after the error bits in the matrix 480 are flipped or reversed, assuming $MAX_{ROW}=2$ and $MAX_{COL}=3$. In other word, three errors in a row would cause none or one error when all of three errors are reversed or flipped, which means none of the three are absolutely sure but there is definitively at most one possible error after the three errors are blindly or unsurely corrected. Nevertheless, this matrix error flipping correction helps reduce the number of errors in a row. Likewise, the same holds true along the columns. With the reduced number of errors, the regular ECC may be applied again to detect the unsure errors or correct them thereafter with the parity codes. Accordingly, it may be concluded that the errors cannot be corrected using the regular ECC when the matrix of errors or error matrix is greater than ($MAX_{ROW}$, $MAX_{COL}$). These errors, however, may be corrected if the error matrix after reversing the bit values is less than ($MAX_{ROW}$, $MAX_{COL}$).

FIG. 4I shows another example of a matrix 486 of errors 4×5. It is still assumed that $MAX_{ROW}=2$ and $MAX_{COL}=3$. What the matrix 486 indicates is that there are no more than two errors in each row and no more than three errors in each column. After flipping the errors, an exemplary matrix 488 still shows that there are no more than two errors in each row and no more than three errors in each column. The regular ECC would not help correct the error matrix 486. It may be concluded that the errors in a matrix may still be corrected if the number of errors in the matrix is less than ($2MAX_{ROW}+1$, $2MAX_{COL}+1$). One of the objectives, advantages and benefits in the matrix-flipping correction is to reduce the number of errors in an isolated block or error matrix so as to apply the ECC again.

FIG. 5A shows a flowchart or process 500 of matrix error flipping correction according to one embodiment of the present invention. The flowchart 500 may be better appreciated in view of FIG. 3B and FIGS. 4A-4I, and implemented in hardware or in combination of software (e.g., firmware) and hardware. The flowchart 350 may be viewed as an operation performed as 352 of FIG. 3B.

Figure 5B:
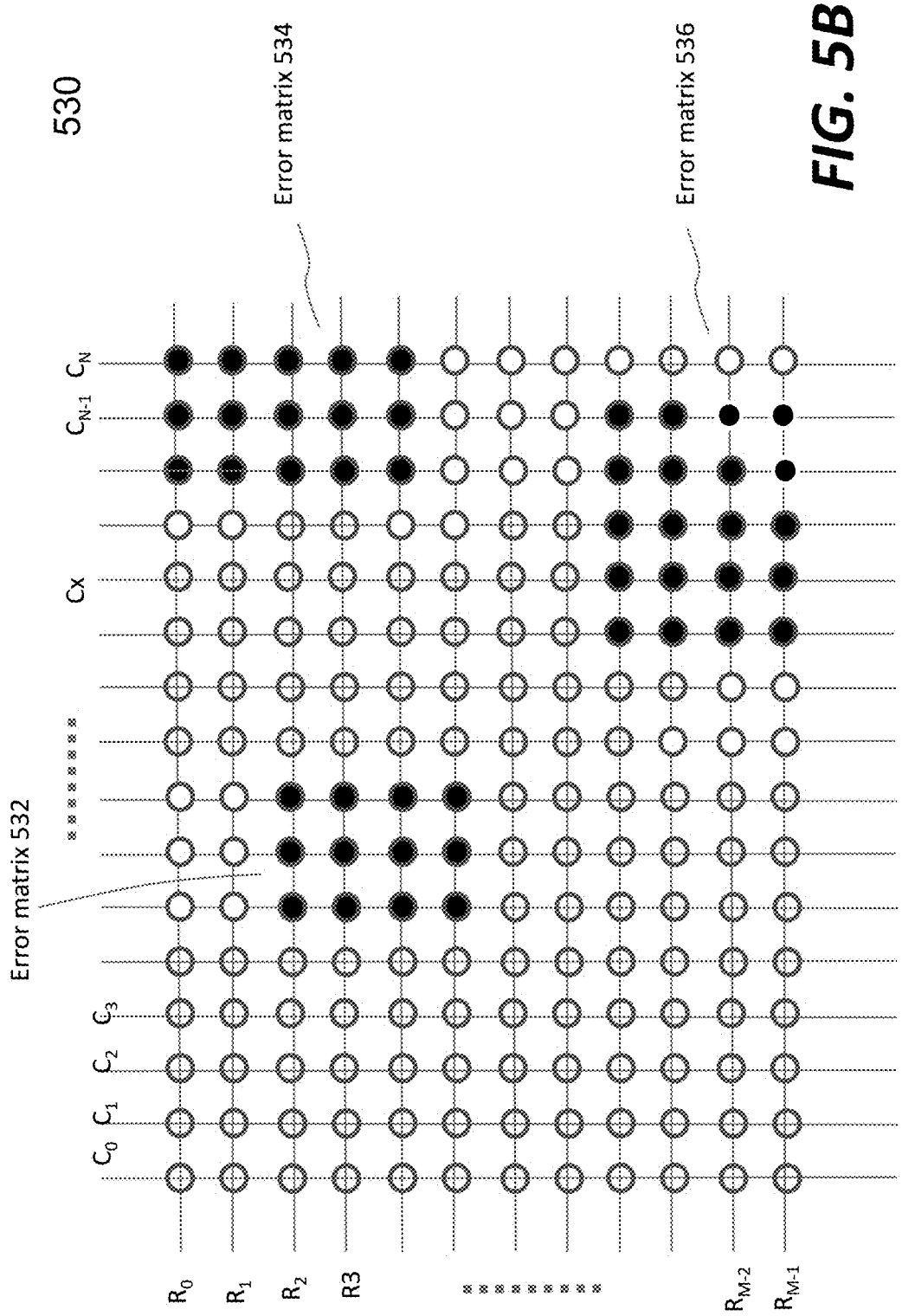
FIG. 5B shows an example of forming several error matrices.

As described above, after respective ECC decoding operations have been applied in two dimensions or repeatedly if needed, the data array is now provided to the process 500. It is assumed that the data array still have errors. These errors are often present in chucks or blocks in a row or column as isolated errors would have been detected and corrected by the ECC. The process 500 goes from 502 to 504, where error matrix or matrices are formed. FIG. 4F and FIG. 4G collectively illustrate an example of forming the error matrix by exchanging rows and/or columns with the errors in terms of their positions in the matrix. With the consideration of the ranges, a matrix is formed under the limit provided by the matrix error flipping correction across the rows and columns. FIG. 5B shows an example 530 of forming several error matrices. All the matrices are isolated from each other so that each can be processed individually. In an event, a standard matrix cannot be formed, elements with known values may be added as padding elements to complete the matrix according to one embodiment. The error matrix 536 in FIG. 5B is shown to have three padding elements (shrank blacken dots).

The process 500 then goes to 510, where the values of the data bits (elements) in an error matrix are flipped. At 512, the process 500 determines if all the formed error matrices have been taken care of. The data array is again going through the ECC decoding operation after the all formed error matrices are flipped.

Referring now back to FIG. 3B, possible errors in the read-out data bits are detected and corrected via the underling ECC decoding including the matrix error flipping correction at 352. At 354, all the known padded data bits are removed. As described above, the padded data bits are all known values. According to one embodiment, the locations of these padded data bits are also used to facilitate the correction of possible errors at some or all of these locations at 348 to further reduce the errors. It should be also noted that some of the padded data bits are used as parameters to indicate what is followed in a next page in the flash memory. When a compressed data segment is broken into two or more pieces spreading over one or more pages, some parameters or signs may be needed to indicate where is the next piece to facilitate the recovery of the data segment from more than one page. The decoded data is read out and assumed that the correctable errors have been corrected.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claim. Accordingly, the scope of the present invention is defined by the appended claims rather than the forgoing description of embodiments.

We claim:

1. A method for keeping integrity of data read from a memory array, the method comprising:
    receiving an array of data bits;
    forming at least an error matrix by consolidating errors in the array of data bits in the error matrix;
    flipping all values of data bits in the error matrix, from "1" to "0" or "0" to "1", to update the array of data bits with flipped data bits in the error matrix;
    applying a first predefined ECC decoding operation to the array of data bits with flipped data bits along a first dimension to detect and correct errors in the flipped data bits to produce the array of data bits with some corrected data bits; and
    applying a second predefined ECC decoding operation to the array of data bits with some corrected data along a second dimension to detect and correct remaining errors in the flipped data bits.

2. The method as recited in claim 1, wherein the array of data bits is from the memory array.

3. The method as recited in claim 2, wherein the memory array is based on flash memories.

4. The method as recited in claim 2, further comprising:
    applying the first predefined ECC decoding operation to the array of data bits along the first dimension; and
    applying the second predefined ECC decoding operation to the array of data bits along the second dimension.

5. The method as recited in claim 4, wherein said forming at least an error matrix comprises:
    exchanging lines with some of the errors in the array of data bits; and
    exchanging rows with some of the errors in the array of data bits to form the error matrix.

6. The method as recited in claim 4, further comprising:
    including some data bits with known values in the error matrix if the errors are not enough to form the error matrix.

7. The method as recited in claim 1, wherein the first predefined ECC is defined by a first maximum number ($MAX_{1st}$) of errors the first predefined ECC is able to correct, the second predefined ECC is defined by a second maximum number ($MAX_{2nd}$) of errors the second predefined ECC is able to correct, and wherein a number of the errors in a row in the error matrix is greater than $MAX_{1st}$ and a number of the errors in a column in the error matrix is greater than $MAX_{2nd}$.

8. The method as recited in claim 7, wherein the number of the errors in a row in the error matrix is less than ($2MAX_{1st}+1$) and the number of the errors in a column in the error matrix is greater than ($2MAX_{2nd}+1$).

9. The method as recited in claim 1, wherein the first predefined ECC decoding operation and the second predefined ECC decoding operation are identical.

10. The method as recited in claim 1, wherein the first predefined ECC decoding operation and the second predefined ECC decoding operation are different.

11. An apparatus for keeping integrity of data read, the apparatus comprising:
    a non-transitory computer readable medium for keeping code;
    a processor, coupled to the non-transitory computer readable medium, executing the code and performing operations of:
        receiving an array of data bits from a memory medium;
        forming at least an error matrix by consolidating errors in the array of data bits in the error matrix;
        flipping all values of data bits in the error matrix, from "1" to "0" or "0" to "1", to update the array of data bits with flipped data bits in the error matrix;
        applying a first predefined ECC decoding operation to the array of data bits with flipped data bits along a first dimension to detect and correct errors in the flipped data bits to produce the array of data bits with some corrected data bits; and
        applying a second predefined ECC decoding operation to the array of data bits with some corrected data along a second dimension to detect and correct remaining errors in the flipped data bits.

12. The apparatus as recited in claim 11, wherein the memory medium is based on flash memories.

13. The apparatus as recited in claim 12, wherein the operations further comprises:
    applying the first predefined ECC decoding operation to the array of data bits along the first dimension; and
    applying the second predefined ECC decoding operation to the array of data bits along the second dimension.

14. The apparatus as recited in claim 13, wherein said forming at least an error matrix comprises:
    exchanging lines with some of the errors in the array of data bits; and
    exchanging rows with some of the errors in the array of data bits to form the error matrix.

15. The apparatus as recited in claim 14, wherein the error matrix includes some data bits with known values in the error matrix if the errors are not enough to form the error matrix.

16. The apparatus as recited in claim 11, wherein the first predefined ECC is defined by a first maximum number ($MAX_{1st}$) of errors the first predefined ECC is able to correct, the second predefined ECC is defined by a second maximum number ($MAX_{2nd}$) of errors the second predefined ECC is able to correct, and wherein a number of the errors in a row in the error matrix is greater than $MAX_{1st}$ and a number of the errors in a column in the error matrix is greater than $MAX_{2nd}$.

17. The apparatus as recited in claim 16, wherein the number of the errors in a row in the error matrix is less than ($2MAX_{1st}+1$) and the number of the errors in a column in the error matrix is greater than ($2MAX_{2nd}+1$).

18. The apparatus as recited in claim 11, wherein the first predefined ECC decoding operation and the second predefined ECC decoding operation are identical.

19. The apparatus as recited in claim 11, wherein the first predefined ECC decoding operation and the second predefined ECC decoding operation are different.

\* \* \* \* \*